United States Patent
Imam et al.

(10) Patent No.: US 6,492,687 B2
(45) Date of Patent: Dec. 10, 2002

(54) MERGED SEMICONDUCTOR DEVICE AND METHOD

(75) Inventors: Mohamed Imam, Tempe; Raj Nair, Chandler; Charles Hoggatt, Tempe, all of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/849,898

(22) Filed: May 7, 2001

(65) Prior Publication Data

US 2002/0163046 A1 Nov. 7, 2002

(51) Int. Cl.[7] .............................................. H01L 29/76
(52) U.S. Cl. ....................................... 257/365; 257/356
(58) Field of Search ................................ 257/365, 132, 257/356; 357/41, 43, 23, 22

(56) References Cited

U.S. PATENT DOCUMENTS

| | | | | |
|---|---|---|---|---|
| 4,199,774 A | * | 4/1980 | Plummer | 357/41 |
| 4,345,265 A | * | 8/1982 | Blanchard | 357/23 |
| 4,402,003 A | * | 8/1983 | Blanchard | 357/43 |
| 4,506,282 A | * | 3/1985 | Baliga | 357/43 |
| 4,638,344 A | * | 1/1987 | Cardwell, Jr. | 357/22 |
| 5,572,048 A | * | 11/1996 | Sugarawa | 257/132 |
| 5,742,084 A | * | 4/1998 | Yu | 257/356 |

* cited by examiner

*Primary Examiner*—David Nelms
*Assistant Examiner*—Thinh Nguyen
(74) *Attorney, Agent, or Firm*—James J. Stipanuk

(57) ABSTRACT

A semiconductor device (20) is formed on a substrate (21) that has first and second well regions (25, 26) formed at a surface (18) of the substrate. A control electrode (34) extends over the surface to activate a first channel (42) with a control signal ($V_{14}$) for routing a current ($I_N$) from a first node (13) of the semiconductor device to an edge (43) of the first well region. The control signal further activates a second channel (46) for routing the current from an edge (45) of the second well region to a second node (15) of the semiconductor device.

19 Claims, 4 Drawing Sheets

MERGED SEMICONDUCTOR DEVICE AND METHOD

BACKGROUND OF THE INVENTION

The present invention relates in general to semiconductor devices and, more particularly, to integrated circuits having a high voltage stage formed with low breakdown voltage transistors.

Many integrated circuits use physically small transistors to achieve a high functional density while maintaining a small die size and low cost. For example, some integrated circuits are formed with metal-oxide-semiconductor field effect transistors (MOSFETS) whose source and drain diffusions are formed as shallow, heavily doped junctions with small feature sizes. The source and drain diffusions are disposed in a well region of the opposite conductivity type and typically have low drain to well region avalanche breakdown voltages.

An integrated circuit formed with low drain to well region breakdown voltage transistors has a disadvantage of being limited to operating with low supply voltages in order to avoid damage to the integrated circuit. However, some applications require signals generated by the integrated circuit to operate at a voltage level greater than the drain to well region breakdown voltage of the individual transistors of the integrated circuit.

Some previous integrated circuits increase a transistor's breakdown voltage by increasing the complexity of the fabrication process. For example, some processes add photomasking and/or diffusion steps to form a lightly doped drain region between the channel region and the heavily doped drain electrode in order to increase the breakdown voltage. However, the additional processing steps increase the cost of the integrated circuit. Moreover, these lightly doped drains increase the on resistance of the transistor, which degrades performance. Other schemes use circuit techniques to increase the breakdown voltage of a stage, but such schemes require a large die area, and therefore result in a high fabrication cost.

Hence, there is a need for a device and method which increases the operating voltage of a portion of an integrated circuit while maintaining a small die area and avoiding the need for additional processing steps in order to maintain a low manufacturing cost.

DETAILED DESCRIPTION OF THE DRAWINGS

In the figures, elements having the same reference numbers have similar functionality.

Figure 1:
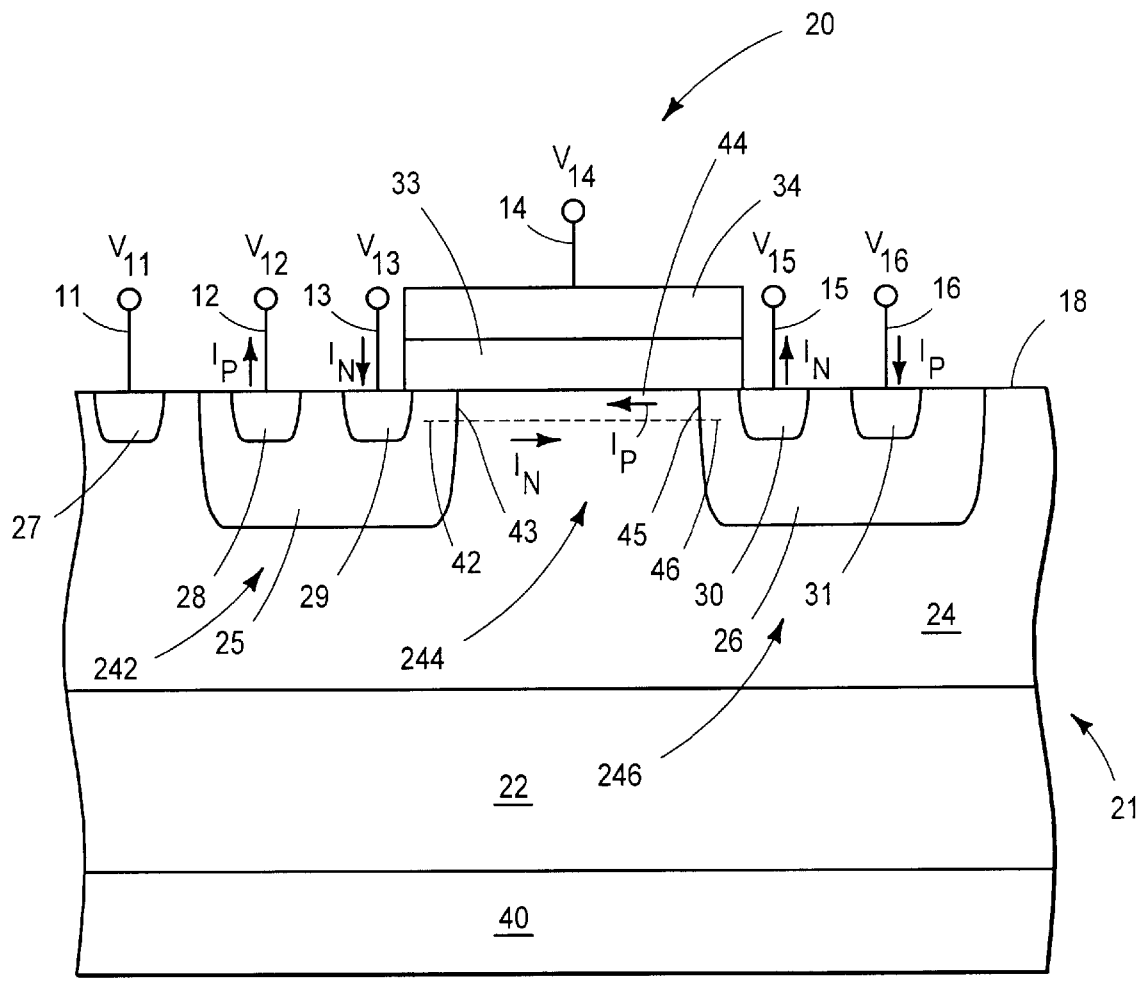
FIG. 1 shows a cross-sectional view of an integrated circuit including a detail of a merged device.

FIG. 1 is a cross-sectional view of an integrated circuit 10 including a detail of a merged device 20 formed on a semiconductor substrate 21 which is mounted to a die attach flag 40 of an integrated circuit package. Merged device 20 is configured to operate through electrodes 11–16 as described below. In one embodiment, integrated circuit 10 is formed with a standard complementary metal-oxide-semiconductor process.

Substrate 21 includes a base layer 22 formed to have a p-type conductivity. In one embodiment, base layer 22 is doped to have an impurity concentration of between $1.0*10^{14}$ and $1.0*10^{15}$ atoms/centimeter$^3$. In an alternative embodiment, a lower portion of base layer 22 is doped to a concentration of about $1.0*10^{20}$ atoms/centimeter$^3$ in order to avoid a latchup condition in integrated circuit 10, while an upper portion comprises a more lightly doped p-type layer having a concentration of about $5.0*10^{14}$ atoms/centimeter$^3$.

A well region 24 is formed by introducing impurities into a surface 18 of substrate 21 which are diffused to a depth of about seven micrometers. In one embodiment, well region 24 is doped to have an n-type conductivity with a typical surface concentration between $1.0*10^{15}$ and $1.0*10^{16}$ atoms/centimeter$^3$.

A well contact 27 is formed with a high conductivity n-type material to a depth of about 0.7 micrometers. Well contact 27 is heavily doped to provide a low resistance and an ohmic contact to an electrode 11 of merged device 20. In one embodiment, well contact 27 has a concentration of about $1.0*10^{20}$ atoms/centimeter$^3$.

A well region 25 and a well region 26 are formed by introducing impurities into surface 18 which are diffused to a depth of about three micrometers. In one embodiment, well regions 25 and 26 are doped to have a p-type conductivity with a typical surface concentration between about $1.0*10^{17}$ and $5.0*10^{17}$ atoms/centimeter$^3$.

A well contact 28 and a well contact 31 are formed within well regions 25 and 26 as shown to have p-type conductivity and a high doping concentration. Well contacts 28 and 31 provide a low resistance and ohmic contacts to electrodes 12 and 16, respectively, of merged device 20. In one embodiment, well contacts 28 and 31 have a concentration of about $1.0*10^{20}$ atoms/centimeter$^3$ and are formed to a depth of about 0.7 micrometers.

A source 29 is formed within well region 25 to have an n-type conductivity and a high doping concentration. In one embodiment, source 29 has a depth of about 0.7 micrometers and a concentration of about $1.0*10^{20}$ atoms/centimeter$^3$. Source 29 provides an ohmic contact to electrode 13 of merged device 20. In one embodiment, the avalanche breakdown voltage from source 29 to well region 25 is about ten volts.

A drain 30 is formed within well region 26 to have an n-type conductivity and high doping concentration. Drain 30 is typically formed concurrently with source 29, and therefore has a similar junction depth and concentration. Drain 30 provides an ohmic contact to electrode 15 of merged device 20. In one embodiment, the avalanche breakdown voltage between drain 30 and well region 26 is about ten volts.

A dielectric layer 33 is formed over surface 18 to extend from source 29 to drain 30. In one embodiment, dielectric layer 33 comprises silicon dioxide formed to a thickness between three hundred and six hundred angstroms. A conductive material 34 is formed over dielectric layer 33 to operate as a gate 34 of merged device 20. In one embodiment, gate 34 is formed with doped polysilicon. Gate 34 is coupled to an electrode 14 of merged device 20.

Merged device 20 operates as follows. When a voltage $V_{14}$ on electrode 14 is at least a conduction threshold VT1 more positive than a voltage $V_{12}$ on electrode 12, an inversion layer or conduction channel 42 forms within well region 25 adjacent to surface 18 and extending from source 29 to an edge 43 of well region 25. Similarly, since well regions 25 and 26 have similar characteristics, when voltage $V_{14}$ is more positive by an amount VT1 than a voltage $V_{16}$ on electrode 16, an inversion layer or channel 46 forms within well region 26 adjacent to surface 18 and extending from drain 30 to an edge 45 of well region 26. When channels 42 and 46 are activated, a current $I_N$ can flow from electrode 13 through source 29, channel 42, well region 24, channel 46 and drain 30 to electrode 15. In one embodiment, conduction threshold VT1 is selected to be two volts.

When voltage $V_{14}$ is at least a conduction threshold VT2 more negative than a voltage $V_{11}$ on electrode 11, well region 24 inverts adjacent to surface 18 to form an inversion layer or conduction channel 44 adjacent to surface 18 and extending from edge 43 of well region 25 to edge 45 of well region 26 as shown. When channel 44 is activated, a current $I_P$ can be routed from electrode 16 through well contact 31, well region 26, channel 44, well region 25 and well contact 28 to electrode 12. In one embodiment, conduction threshold VT2 is selected to be 2.5 volts.

Note that merged device 20 can be biased so that $V_{14}$ is more than VT1 volts more positive than $V_{12}$ and also VT2 volts more negative than $V_{11}$. In that case, currents $I_N$ and $I_P$ can flow concurrently along their respective current paths as described above.

Figure 2:
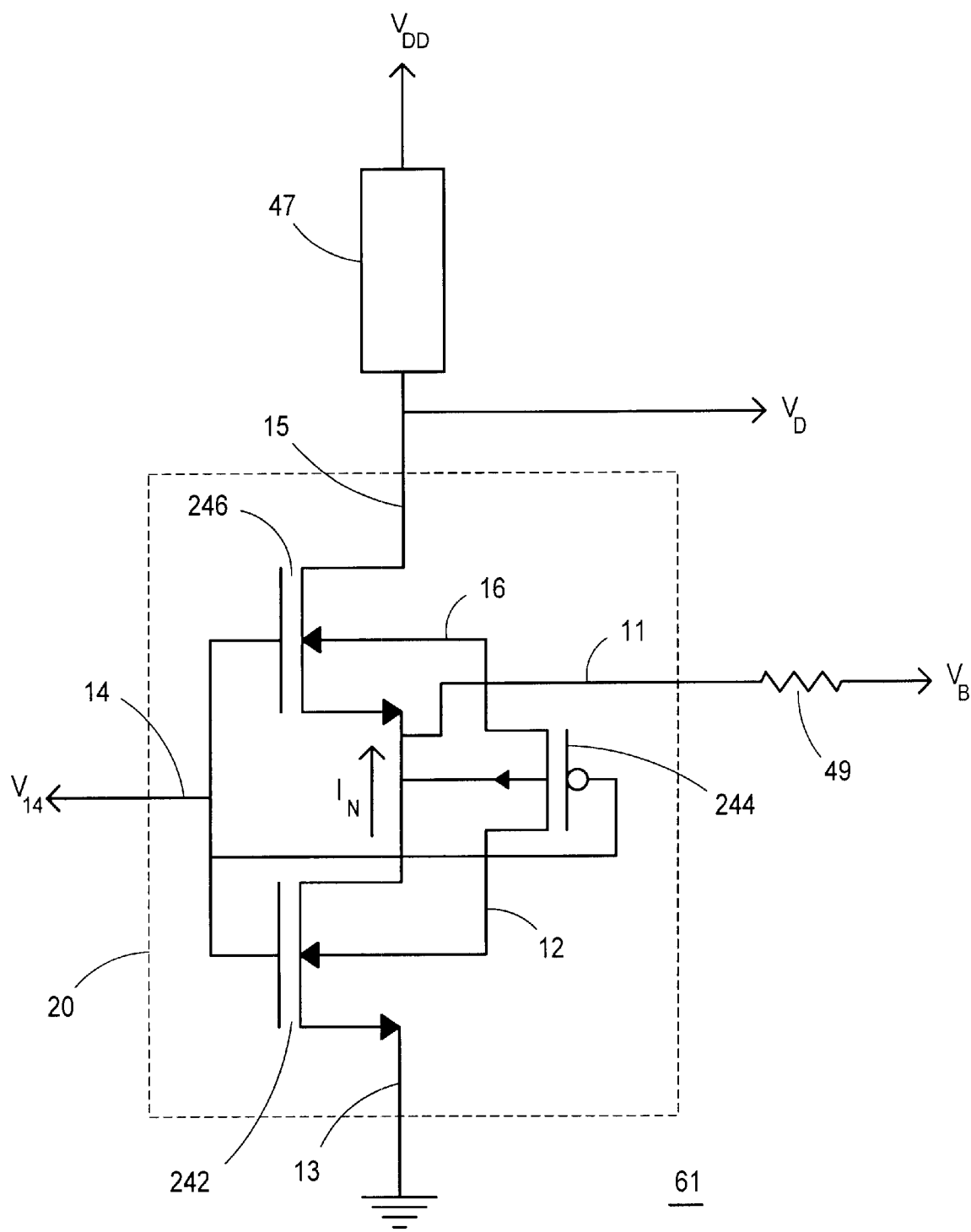
FIG. 2 shows a schematic diagram of a high voltage switch formed with the merged device.

FIG. 2 is a schematic diagram showing merged device 20 used in a high voltage switch 61, including a resistor 49 and a load element 47. An input signal $V_{14}$ is received at electrode 14 of merged device 20 and an output signal $V_D$ is produced at electrode 15 of merged device 20. Switch 61 operates from a supply voltage $V_{DD}$=14.0 volts, which is greater than the ten volt drain 30 to well region 26 avalanche breakdown voltage of merged device 20. Resistor 49 and load element 47 may be either internal or external components of switch 61.

Resistor 49 is a bias resistor used to set the potential of electrode 11 to a bias voltage $V_B$ when merged device 20 is turned off, and to limit the current load on well region 24 when merged device 20 is turned on. In one embodiment, $V_B$=7.0 volts and resistor 49 has a value of about one megohm to limit the current flowing to $V_B$ to about seven microamperes.

Load element 47 may be either a passive or active component suitable for developing output signal $V_D$ with merged device 20. In one embodiment, merged device 20 switches a current $I_N$=14.0 milliamperes and load element 47 comprises a resistor having a value of one kilohm to develop output signal $V_D$ as a square wave operating between ground potential and $V_{DD}$, or fourteen volts. Alternatively, $V_{DD}$ has a value of seven volts and load element 47 comprises an inductor selected so that merged device 20 switches current $I_N$ to produce output signal $V_D$ as substantially a sine wave operating between ground potential and fourteen volts.

Merged device 20 is shown as an equivalent circuit diagram. Channels 42 and 46 have operating characteristics similar to those of standard n-channel metal-oxide-semiconductor field effect transistors (MOSFET), and therefore are represented by n-channel MOSFET transistors 242 and 246, respectively. Similarly, channel 44 has characteristics similar to those of a p-channel MOSFET, and therefore is represented by a p-channel MOSFET transistor 244. Electrodes 12 and 13 are biased at ground potential to maintain well region 25 and source 29 at the same potential to avoid a latchup condition. Electrode 16 is floating, so no current flows through transistor 244.

In operation, assume that $V_{DD}$=14.0 volts and load element 47 comprises a one kilohm resistor. Further assume that $V_B$=7.0 volts and $V_G$ initially is operating at ground potential. Source 29 is at ground potential and $V_G$ is less than VT1=2.0 volts, so transistors 242 and 246 are off. Hence, no current flows and well region 24 and electrode 11 operate at a potential $V_{11}$=7.0 volts. Output signal $V_D$ operates at a potential equal to $V_{DD}$ as a logic high.

Merged device 20 avoids breaking down because of the stacking arrangement of transistors 242 and 246. It can be shown that under the described operating conditions, drain 30 and electrode 15 have a breakdown voltage VBD given by the equation VBD=$V_{DSS}$+VT2+(GAMMA*SQRT($V_{11}$)), where $V_{DSS}$=10.0 volts is the drain 30 to well region 26 breakdown voltage and GAMMA is a constant that depends on the doping of well region 24 and the thickness of dielectric layer 33. In one embodiment, VT2=2.5 volts and GAMMA=0.8, so VBD=14.62 volts, approximately. Hence, electrode 15 of merged device 20 can withstand a higher voltage than its drain 30 to well region 26 avalanche voltage.

When V–is increased above conduction threshold VT1=2.0 volts, transistor 242 turns on, sinking current through resistor 49 to discharge electrode 11 and reduce the potential of well region 24. When electrode 11 decays to a level that is VT1 volts below $V_{14}$, transistor 246 turns on, driving output voltage $V_D$ to about ground potential as a logic low.

Figure 3:
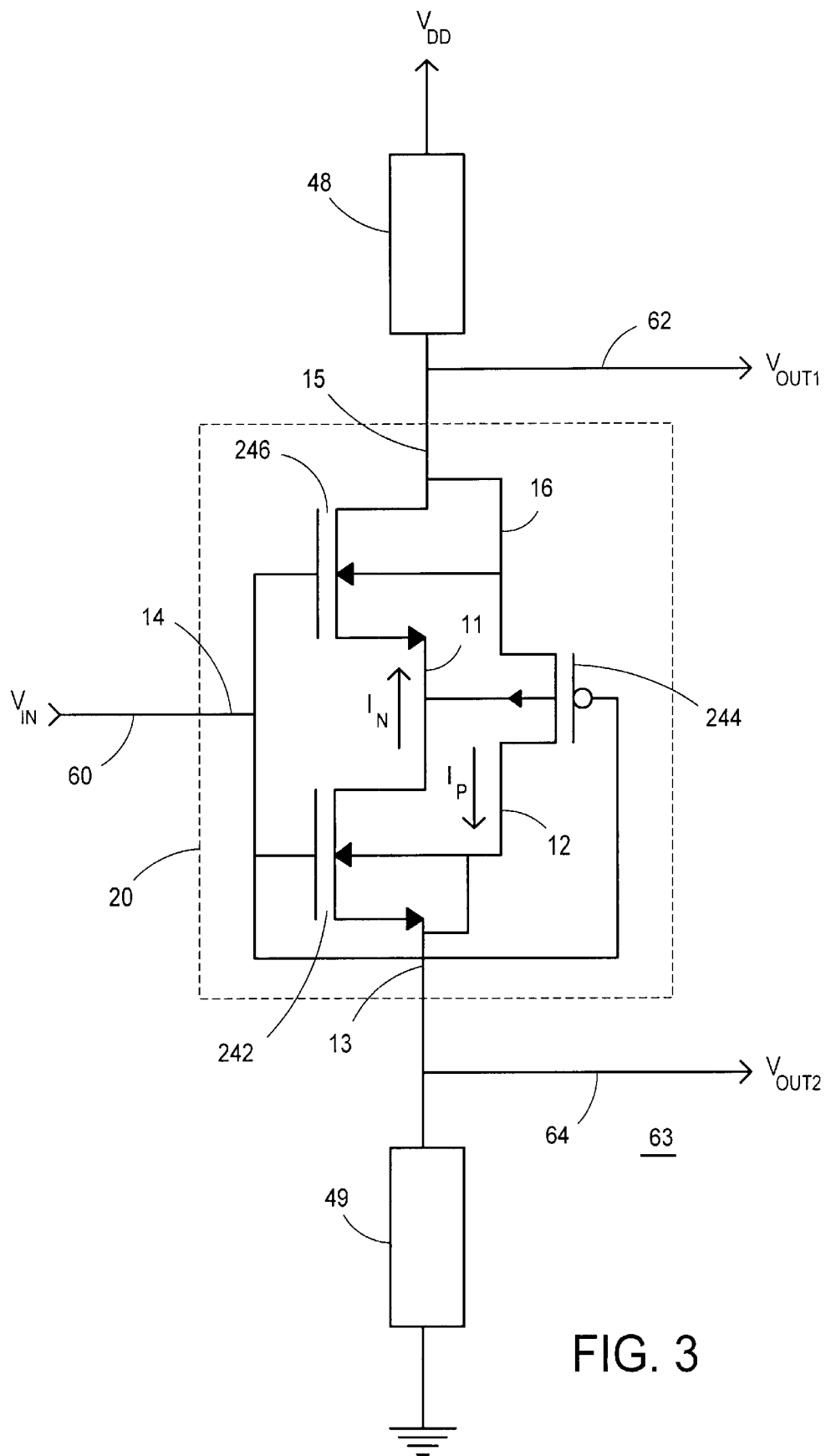
FIG. 3 shows a schematic diagram of a level shifting circuit formed with the merged device.

FIG. 3 is a schematic diagram showing merged device 20 used in a dual level shifter 63, including resistors 48 and 49. An input 60 is coupled to electrode 14 for receiving an input signal $V_{IN}$ and outputs 62 and 64 provide level shifted output signals $V_{OUT1}$ and $V_{OUT2}$, respectively. Level shifter 63 operates from a supply voltage $V_{DD}$=10.0 volts.

Electrodes 15 and 16 of merged device 20 are coupled together so that drain 30 and well region 26 operate at the same potential. This configuration avoids a latchup condition and enables current paths for routing current $I_N$ through transistors 242 and 246 and current $I_P$ through transistor 244, respectively. Input signal $V_{IN}$ includes both direct current (DC) and alternating current (AC) components. The DC component biases merged device 20 so that transistors 242, 244 and 246 are maintained in an on state. In one embodiment, $V_{IN}$ has a DC component of five volts and an AC component which has a peak to peak amplitude of two volts. Hence, $V_{IN}$ oscillates between four and six volts. Resistors 48 and 49 each have a value of five kilohms.

Level shifter 63 operates as follows. Transistor 242 functions as an n-channel source follower which level shifts output 64 to a potential that is VT1=2.0 volts lower than the level of $V_{IN}$. Hence, $V_{OUT2}$=$V_{IN}$–VT1, so $V_{OUT2}$ has a DC component equal to about three volts and oscillates between two and four volts. Similarly, transistor 244 operates as a p-channel source follower which level shifts output 62 to a potential that is VT2=2.5 volts higher than the level of $V_{IN}$. Hence, $V_{OUT1}$=$V_{IN}$+VT2, so $V_{OUT1}$ has a DC component of 7.5 volts and oscillates between 6.5 and 8.5 volts. $V_{IN}$, $V_{OUT1}$, and $V_{OUT2}$ are all in phase.

When $V_{IN}$ increases, current $I_N$ increases to maintain the level shift at output 64 constant, while current $I_P$ decreases by about the same amount to maintain the level shift at output 62 constant. Similarly, when $V_{IN}$ decreases, current $I_P$ increases and current $I_N$ decreases by about the same amount. Hence, the sum ($I_N$+$I_P$) has a substantially constant value of about 0.45 milliamperes.

Figure 4:
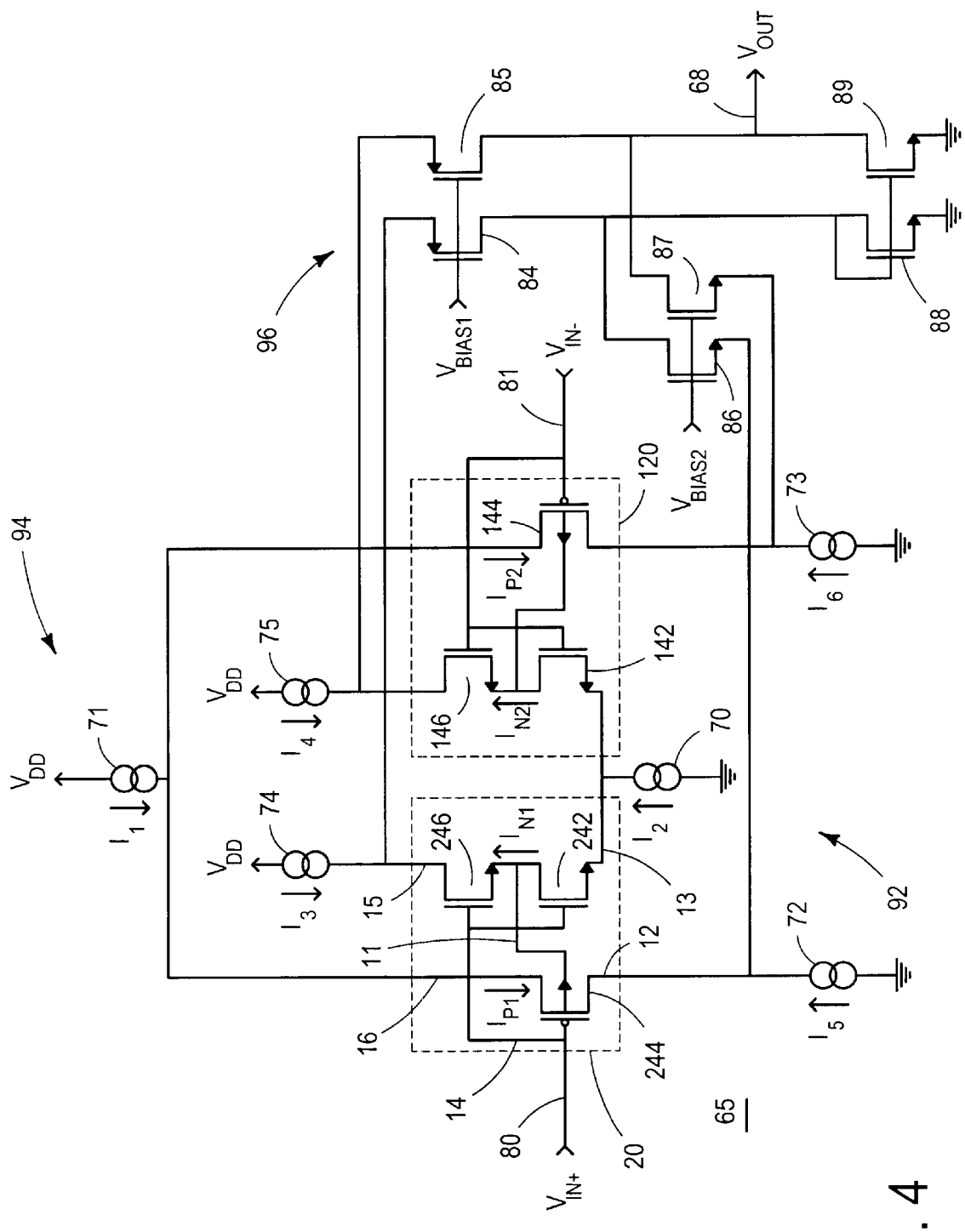
FIG. 4 shows a schematic diagram of an amplifier formed with the merged device.

FIG. 4 is a schematic diagram of merged devices 20 and 120 used in an amplifier 65 having inputs 80 and 81 with a "rail to rail" input common mode operating range. That is, amplifier 65 remains within its specified amplification range even when differential input signals $V_{IN+}$ and $V_{IN-}$ are operating within either conduction threshold voltage VT2 of a supply voltage $V_{DD}=10.0$ volts or within conduction threshold VT1 of ground potential. An output 68 produces an amplified output signal $V_{OUT}$.

Amplifier 65 includes a differential amplifier 92 that controls $V_{OUT}$ when inputs 80 and 81 are operating with a common mode potential greater than ($V_{DD}$-VT2), and a differential amplifier 94 that controls $V_{OUT}$ when the common mode input potential is less than VT1. At other common mode input potentials, control is shared between differential amplifiers 92 and 94. A foldback cascode circuit 96 combines currents from differential amplifiers 92 and 94 to ensure functionality within an input common mode range of zero to ten volts.

Differential amplifier 92 includes a current source 70, n-channel transistors 242 and 246 of merged device 20, n-channel transistors 142 and 146 of merged device 120, and current sources 74–75. Current source 70 supplies a biasing current $I_2=20.0$ microamperes and current sources 74 and 75 supply load currents $I_3=10.0$ microamperes and $I_4=10.0$ microamperes, respectively.

Transistors 242 and 142 have commonly coupled sources for operating a differential pair, routing a portion of bias current 12 through transistors 242 and 246 as a current $I_{N1}$ and the remainder through transistors 142 and 146 as a current $I_{N2}$. The relationship between $I_{N1}$ and $I_{N2}$ is a function of the amplitude and polarity of a differential signal ($V_{IN+}-V_{IN-}$). For example, if $V_{IN+}$ is more positive than $V_{IN-}$, then current $I_{N1}$ is greater than $I_{N2}$, and vice versa.

Differential amplifier 94 includes a current source 71, p-channel transistor 244 of merged device 20, p-channel transistor 144 of merged device 120, and current sources 72–73. Current source 71 supplies a bias current $I_1=20.0$ microamperes and current sources 72 and 73 supply load currents $I_5=10.0$ microamperes and $I_6=10.0$ microamperes, respectively.

Transistors 244 and 144 operate as a differential pair, routing a portion of bias current $I_1$ through transistor 244 as a current $I_{P1}$ and the remainder through transistor 144 as a current $I_{P2}$. The relationship of $I_{P1}$ to $I_{P2}$ is a function of the awplitude and polarity of ($V_{IN+}-V_{IN-}$). If $V_{IN+}$ is more positive than $V_{IN-}$, then current $I_{P1}$ is less than $I_{P2}$, and vice versa.

Foldback cascode circuit 96 includes transistors 84–89, which are configured to ensure that amplifier 65 remains in an active amplifying mode even when the common mode level of $V_{IN+}$ and $V_{IN-}$ is near either $V_{DD}$ or ground potential.

Transistors 84–85 are standard p-channel MOSFETS operating in a cascode configuration whose gates are set to a bias voltage $V_{BIAS1}$ which is selected to have a value that is at least a conduction threshold VT2=2.5 volts more negative than $V_{DD}$. In one embodiment, $V_{BIAS1}=7.0$ volts. Similarly, transistors 86–87 are standard n-channel MOSFETS operating in a cascode configuration with gates biased to a bias voltage $V_{BIAS2}$ which is selected to have a value greater than a conduction threshold VT1. In one embodiment, VT1=3.0 volts. Transistors 88–89 are matching transistors operating as a current mirror. Difference currents ($I_3-I_{N1}$) and ($I_4-I_{N2}$) are routed through transistors 84 and 85, respectively, while difference currents ($I_5-I_{P1}$) and ($I_6-I_{P2}$) are routed through transistors 86 and 87, respectively.

The operation of amplifier 65 is described as follows. Assume that inputs 80–81 are operating at equilibrium near ground potential, i.e., $V_{IN+}=V_{IN-}=1.0$ volts. Then differential amplifier 92 is inactive, so currents $I_3$ and $I_4$ flow equally through transistors 84 and 85, respectively. Differential amplifier 94 is active and balanced, with $I_{P1}=I_{P2}=I_5=I_6=10.0$ microamperes, so no current flows through transistors 86 and 87. Current $I_3$ is mirrored through transistors 88–89 to produce a current through transistor 89 that is balanced by the current through transistor 85. Hence, no current is available to alter the potential of output signal $V_{OUT}$.

Now assume that input signal $V_{IN+}$ is more positive than input signal $V_{IN-}$. Then $I_P$, is less than $I_{P2}$, and more current flows through transistor 86 than through transistor 87. Hence, a smaller current is mirrored through transistors 88–89 than the current through transistor 85. The difference between the transistor 89 and transistor 85 currents charges output 68 and increases the potential of output signal $V_{OUT}$. If $V_{IN+}$ is more negative than $V_{IN-}$, $I_{P1}$ is greater than $I_{P2}$, and more current flows through transistor 87 than through transistor 86. Hence, a larger current is mirrored through transistors 88–89 to pull down output 68 than the current through transistor 85. The difference between the transistor 89 current and transistor 85 discharges output 68 and reduces the potential of output signal $V_{OUT}$.

Now assume that inputs 80–81 are operating at equilibrium with a common mode level near $V_{DD}$, i.e., $V_{IN+}=V_{IN-}=9.0$ volts. Then differential amplifier 94 is inactive, so $I_{P1}$ and $I_{P2}$ are zero and currents $I_5$ and $I_6$ flow through transistors 86 and 87, respectively. Since differential amplifier 92 is active and balanced, $I_{N1}=I_{N2}=5.0$ microamperes, and difference currents ($I_3-I_{N1}$)=5.0 microamperes and ($I_4-I_{N2}$)=5.0 microamperes flow through transistors 84 and 85, respectively. Difference current ($I_3-I_{N1}$) is mirrored to produce a current through transistor 89 that is balanced by the current through transistor 85.

If input signal $V_{IN+}$ is more positive than input signal $V_{IN-}$, current $I_{N1}$ is greater than $I_{N2}$, and more current flows through transistor 85 than through transistor 84. Hence, a smaller current is mirrored through transistors 88–89 than the current through transistor 85, so $V_{OUT}$ increases in potential. If $V_{IN+}$ is more negative than $V_{IN-}$, $I_{N1}$ is less than $I_{N2}$, and more current flows through transistor 84 than through transistor 85. Hence, a larger current is mirrored through transistors 88–89 than the current through transistor 85, which reduces the value of output signal $V_{OUT}$.

Note that differential amplifiers 92 and 94 function substantially independently. When both are active, their operation is superposed, thereby maintaining the specified amplification in a common mode input range from zero to a level substantially equal to $V_{DD}$. Despite this independence, the compact layout of merged devices 20 and 120 allows amplifier 65 to be fabricated with a smaller die area and lower cost than other amplifiers having similar functionality and made with a similar process.

In summary, the present invention provides a merged semiconductor device that provides a high degree of functionality while occupying a small die area. A semiconductor substrate has a surface for forming first and second well regions. A control electrode extends over the surface of the substrate to activate a first channel with a control signal to route a first current from a first node to an edge of the first well region. The control electrode activates a second channel for routing the first current from an edge of the second well region to a second node. The semiconductor device is formed on a standard integrated circuit process and has a compact size, which maintains a low fabrication cost.

What is claimed is:

1. A semiconductor device (20), comprising:
a substrate (21) having a surface (18) for forming first, second and third well regions (25, 26, 24); and
a control electrode (34) extending over the surface of the substrate to activate a first channel (42) in the first well region with a control signal ($V_{14}$) to route a first current ($I_N$) from a first node (13) of the semiconductor device to an edge (43) of the first well region, and a second channel (46) in the second well region to route the first current from an edge (45) of the second well region to a second node (15) of the semiconductor device, wherein the control signal inverts the third well region to form a third channel for routing a second current ($I_P$) between the first and second well regions.

2. The semiconductor device of claim 1, wherein the first current flows through the substrate from the edge of the first well region to the edge of the second well region.

3. The semiconductor device of claim 1, further comprising a source region (29) disposed within the first well region for routing the first current to the first channel.

4. The semiconductor device of claim 3, further comprising a drain region (30) disposed within the second well region and coupled to the second channel for receiving the first current.

5. The semiconductor device of claim 1, wherein the first and second well regions have a first conductivity type and the third well region has a second conductivity type.

6. The semiconductor device of claim 5, further comprising source and drain regions formed within the first and second well regions, respectively, and having the second conductivity type.

7. The semiconductor device of claim 1, further comprising:
a first electrode (16) disposed on the surface of the substrate and coupled to the second well region for providing the second current; and
a second electrode (12) disposed on the surface of the substrate and coupled to the first well region for receiving the second current.

8. The semiconductor device of claim 5, wherein the second well region is electrically coupled to the third well region.

9. The semiconductor device of claim 1, further comprising a package for housing the substrate and the control electrode.

10. A semiconductor device (20), comprising;
a semiconductor substrate (21) having a first conductivity type;
a first well region (25) formed in the semiconductor substrate and having a second conductivity type;
a second well region (26) formed in the semiconductor substrate and having the second conductivity type; and
a conductive material (34) formed over the semiconductor substrate to extend from the first well region to the second well region, where a control signal ($V_{14}$) applied to the conductive material enables a first conduction path (42) in the first well region for providing a first current ($I_N$) to an edge (43) of the first well region into the semiconductor substrate, a second conduction path in the second well region (46) for routing the first current from an edge (45) of the second well region, and a third conduction path formed in the semiconductor substrate for routing a second current from the second well region through the semiconductor substrate to the first well region.

11. The semiconductor device of claim 10, further comprising source and drain regions (29, 30) formed within the first and second well regions, respectively, where the current flows from the source region through the first conduction path to the semiconductor substrate and through the second conduction path to the drain region.

12. The semiconductor device of claim 11, wherein the source and drain regions are formed to have the first conductivity type.

13. The semiconductor device of claim 11, wherein the first well region is biased to a potential of the source region.

14. The semiconductor device of claim 11, further comprising:
a first electrode (13) formed over a surface (18) of the semiconductor substrate for routing the first current to the source region; and
a second electrode (15) formed over the semiconductor substrate for receiving the first current from the drain region.

15. A method of controlling first and second currents ($I_N$), comprising the steps of:
providing a substrate (21) having first and second well regions (25, 26);
inverting the first well region with a control signal ($V_{14}$) to route the first current through a first channel (42) to the substrate;
inverting the second well region with the control signal to route the first current from the substrate through a second channel; and
inverting the substrate with the control signal to route the second current between the first and second well regions.

16. The method of claim 15, further comprising the step of routing the first current from a source region (29) within the first well region through the first channel.

17. The method of claim 16, further comprising the step of routing the first current from the second channel to a drain region (30) within the second well region.

18. The method of claim 15, further comprising the step of applying the control signal to a control electrode to invert the first and second well regions.

19. The method of claim 15, wherein the step of inverting the first well region includes the step of routing the first current to an edge (43) of the first well region with the control signal.

* * * * *